(12) United States Patent
Shah et al.

(10) Patent No.: US 11,677,408 B2
(45) Date of Patent: Jun. 13, 2023

(54) COMBINED I/Q DIGITAL-TO-ANALOG CONVERTER

(71) Applicant: QUALCOMM Incorporated, San Diego, CA (US)

(72) Inventors: Peter Shah, San Diego, CA (US); Matthew Sienko, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/448,683

(22) Filed: Sep. 23, 2021

(65) Prior Publication Data
US 2023/0085720 A1    Mar. 23, 2023

(51) Int. Cl.
*H03M 1/66* (2006.01)
*H03M 1/06* (2006.01)

(52) U.S. Cl.
CPC ................ *H03M 1/0617* (2013.01)

(58) Field of Classification Search
CPC .... H03M 1/0617; H03M 1/12; H03M 1/1205; H03M 1/66
USPC .......... 341/143, 144, 155, 118, 120
See application file for complete search history.

(56) References Cited

U.S. PATENT DOCUMENTS

| | | | |
|---|---|---|---|
| 2011/0150125 A1* | 6/2011 | Yu | H03M 1/68 375/295 |
| 2016/0048707 A1* | 2/2016 | Alladi | G06G 7/186 327/337 |
| 2020/0220524 A1* | 7/2020 | Hong | H03M 1/66 |

OTHER PUBLICATIONS

International Search Report and Written Opinion—PCT/US2022/040809—ISA/EPO—dated Dec. 12, 2022.
Kester W., "MT-015 Tutorial Basic DAC Architectures II: Binary DACs", Jan. 1, 2009, pp. 1-10, XP055224386, p. 6, figure 7.
Razavi B., et al., "Charge Steering: A Low-Power Design Paradigm", Proceedings of the IEEE 2013 Custom Integrated Circuits Conference, IEEE, Sep. 22, 2013, pp. 1-8, XP032524631, sections I, II, figure 1.
Shen Y., et al., "A 0.5-3 GHz I/Q Interleaved Direct-Digital RF Modulator with up to 320 MHZ Modulation Bandwidth in 40 nm CMOS", 2020 IEEE Custom Integrated Circuits Conference (CICC), IEEE, Mar. 22, 2020, pp. 1-4, XP033762153, sections II, III, figures 2,3.

* cited by examiner

*Primary Examiner* — Peguy Jean Pierre
(74) *Attorney, Agent, or Firm* — Haynes and Boone, LLP

(57) ABSTRACT

A combined I/Q DAC is provided with a plurality of sources corresponding to a plurality of selectors in which the corresponding source drives the corresponding selector with a source signal to produce a corresponding pair of in-phase and quadrature-phase analog input signals to a summation network. Each selector routes its source signal responsive to a digital value of a corresponding in-phase and quadrature-phase bit pair.

29 Claims, 9 Drawing Sheets

- Prior Art -

US 11,677,408 B2

COMBINED I/Q DIGITAL-TO-ANALOG CONVERTER

TECHNICAL FIELD

This application relates to digital-to-analog converters, and more particularly to a combined or single I/Q digital-to-analog converter.

BACKGROUND

The digital or baseband processing section of communication systems such as transceivers often generates digital signals using quadrature signaling. There is thus an in-phase (I) digital signal and a quadrature-phase (Q) digital signal. To convert the I and Q digital signals into analog signals so that they may be frequency translated, combined and transmitted, the transceiver will typically include a digital-to-analog converter (DAC) to convert the in-phase digital signal and another DAC to convert the quadrature-phase digital signal. The repetition of the DACs for the I and Q channels occupies die space. In addition, the noise from each DAC is uncorrelated and thus lowers the overall signal-to-noise ratio in the combined analog signal that results from the combination of the analog I and Q signals from the respective DACs.

SUMMARY

In accordance with an aspect of the disclosure, a combined in-phase and quadrature-phase digital-to-analog converter is provided that includes: a plurality of selectors corresponding to a plurality of in-phase and quadrature-phase bit pairs; a plurality of sources corresponding to the plurality of selectors, wherein each selector is configured to convert a source signal from the corresponding source into an in-phase analog input signal and a quadrature-phase analog input signal responsive to the corresponding in-phase and quadrature-phase bit pair; and a summation network configured to sum the in-phase analog input signals from each selector in the plurality of selectors to form an in-phase analog output signal and to sum the quadrature-phase analog input signals from each selector in the plurality of selectors to form a quadrature-phase analog output signal.

In accordance with another aspect of the disclosure, a method of operation for a combined I/Q DAC is provided that includes: driving a plurality of multiplexers with a corresponding plurality of source signals such that each multiplexer is driven with a corresponding source signal from the plurality of source signals; providing each multiplexer with a corresponding in-phase and quadrature-phase bit pair; and multiplexing the corresponding source signal through each multiplexer to a node in a summation network responsive to a digital value of the corresponding in-phase and quadrature-phase bit pair.

In accordance with a third aspect of the disclosure, a combined in-phase and quadrature-phase digital-to-analog converter is provided that includes: a summation network including a plurality of nodes for an in-phase analog output signal and a quadrature-phase analog output signal; a plurality of sources; and a plurality of multiplexers corresponding to the plurality of sources, each multiplexer coupled to a corresponding source from the plurality of sources and being configured to multiplex a source signal from the corresponding source to a corresponding node from the plurality of nodes responsive to a digital value of a corresponding in-phase and quadrature-phase bit pair.

These and other advantageous features may be better appreciated through the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

A combined I/Q DAC is provided that eliminates the need for the I and Q analog input signals to each be converted in their own DAC. A combined I/Q DAC may also be denoted herein as a single I/Q DAC since there is no longer a separate in-phase DAC and a separate quadrature-phase DAC. As will be explained further herein, the resulting single or combined I/Q DAC has several advantages over the traditional dedicated I and Q DAC approach, including lower power consumption, increased density, elimination of the need to match source arrays, and reduced noise. To provide a deeper appreciation of these advantages, a dedicated I and Q DAC architecture will first be discussed.

Figure 1:
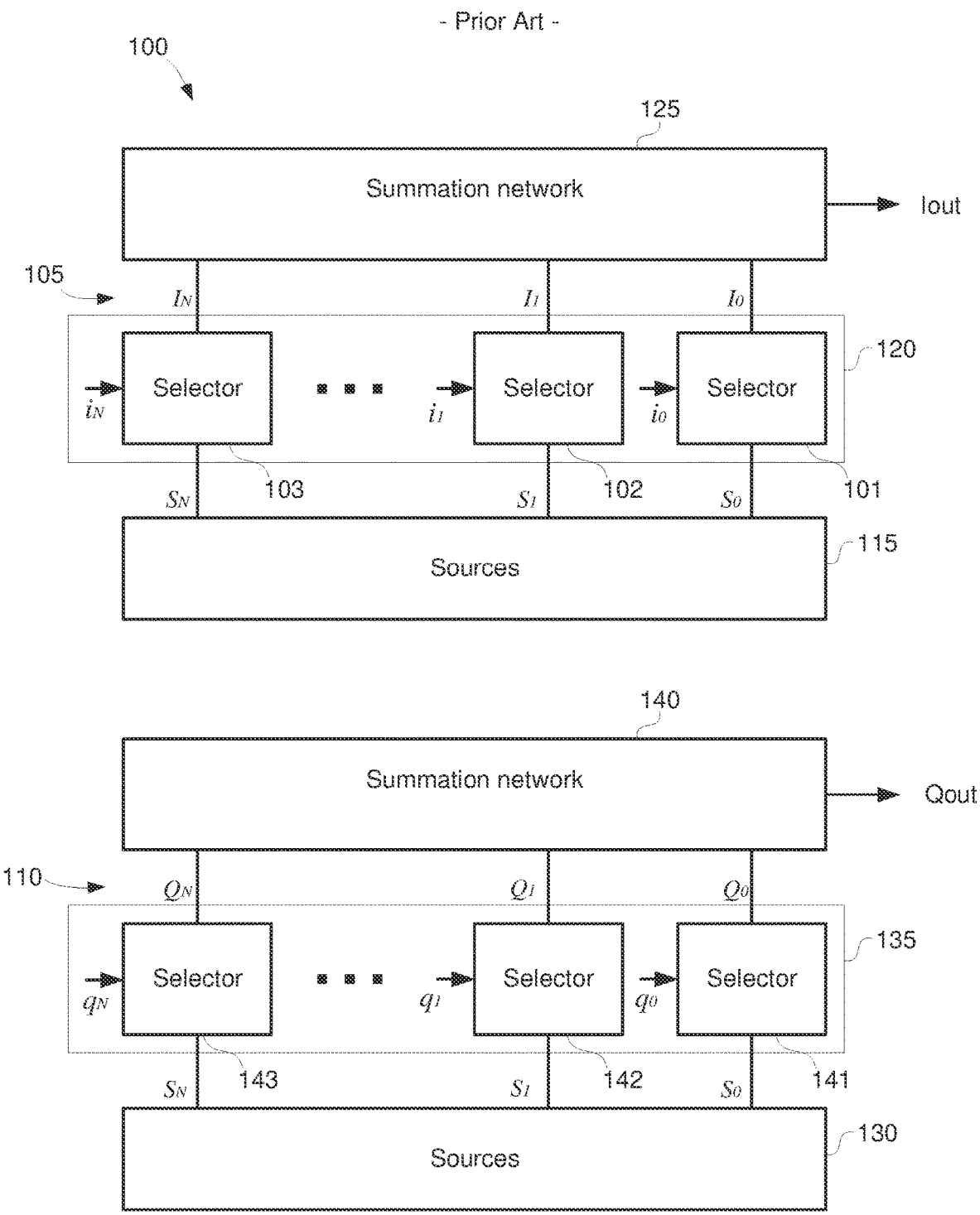
FIG. 1 illustrates an example dedicated I and Q DAC system.

A dedicated I and Q DAC system 100 is shown in FIG. 1. An in-phase (I) DAC 105 converts an (N+1) bit wide in-phase digital input signal into an analog output signal Iout, where N is a plural positive integer. The in-phase digital input signal ranges from a zeroth bit $i_0$ to an Nth bit $i_N$. In-phase DAC 105 includes a plurality of selectors 120 that convert corresponding bits from the in-phase digital input signal into analog input signals. For example, the zeroth in-phase bit $i_0$ is converted into an in-phase analog input signal $I_0$ in a zeroth selector 101, a first selector 102 converts a first in-phase bit $i_1$ into a first in-phase analog input signal $I_1$, and an Nth selector 103 converts the Nth in-phase bit $i_N$ into an Nth in-phase analog input signal $I_N$. Each selector converts the corresponding in-phase input bit using a corresponding source signal. A summation network 125 combines the in-phase analog input signals from selectors 120 to form the in-phase analog output signal Iout. To produce the source signals, in-phase DAC 105 includes a plurality of (N+1) sources 115. For illustration clarity, sources 115 are not shown individually in FIG. 1 but are denoted by their source signals.

A zeroth source in DAC 105 generates a zeroth source signal so for zeroth selector 101, a first source generates a first source signal $s_1$ for first selector 102, and so on such that an Nth source generates the Nth source signal $s_N$ for Nth selector 103. The sources may be weighted. For example, the source signals may be binary weighted. Similarly, the summation network 125 may optionally weight the in-phase analog input signals from selectors 120.

A quadrature-phase (Q) DAC 110 is arranged analogously as discussed for in-phase DAC 105. Quadrature-phase DAC 110 converts a quadrature-phase digital input signal into a quadrature-phase analog output signal Qout. The quadrature-phase digital input signal ranges from a zeroth quadrature-phase input bit $q_0$ to an Nth quadrature-phase input bit $q_N$. Quadrature-phase DAC 110 thus includes a plurality of (N+1) sources 130 that generate a plurality of (N+1) source signals. A plurality of selectors 135 convert the quadrature-phase input bits to DAC 110 into quadrature-phase analog input signals for a summation network 140. Each selector generates a corresponding quadrature-phase analog input signal to summation network 140. A zeroth selector 141 converts the zeroth quadrature-phase input bit $q_0$ into a zeroth quadrature-phase analog input signal $Q_0$ using the zeroth source signal so from the zeroth source. Similarly, a first selector 142 coverts the first quadrature-phase input bit $q_1$ into a first quadrature-phase analog input signal $Q_1$ using the first source signal $s_1$ from the first source, and so on such an Nth selector 143 converts the Nth quadrature-phase input bit $q_N$ into an Nth quadrature-phase analog input signal $Q_N$ using the Nth source signal $s_N$ from the Nth source. Summation network 140 combines the quadrature-phase analog input signals to form the quadrature-phase analog output signal Qout.

Figure 2A:
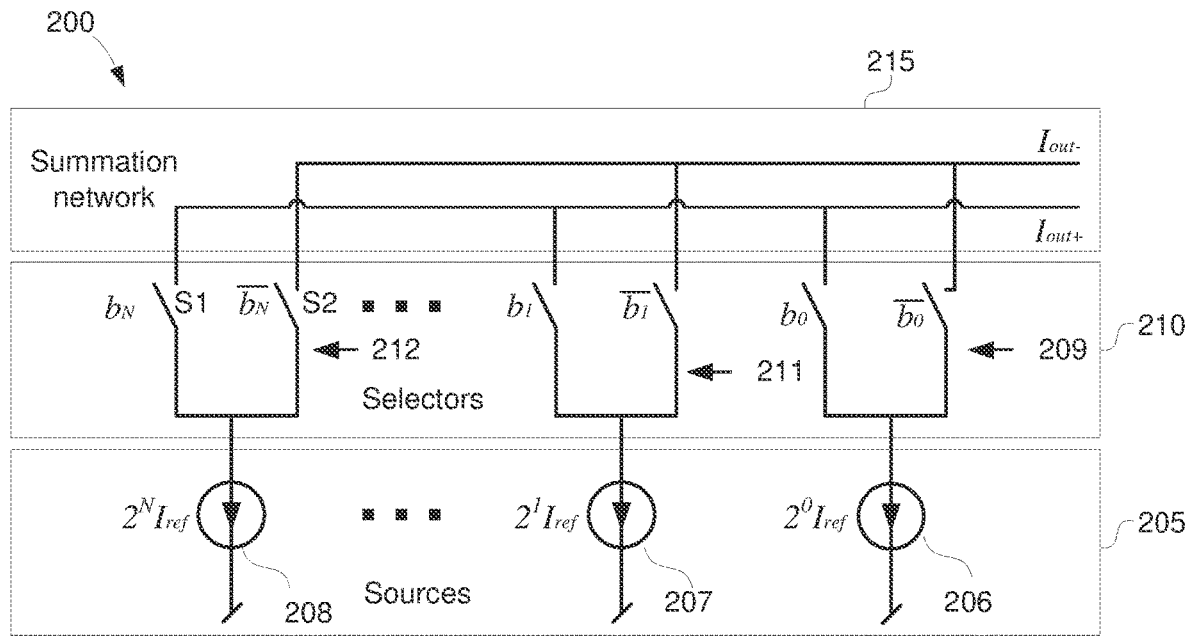
FIG. 2A is a diagram of an example implementation of the in-phase DAC in the system of FIG. 1.

An example implementation 200 for in-phase DAC 105 is shown in FIG. 2A. A plurality of sources 205 is formed by a plurality of current sources. Each source signal is thus a current signal although voltage or charge signals may also be used. Sources 205 range from a zeroth current source 206 to an Nth current source 208. Sources 205 are binary weighted according to the bit significance of their corresponding in-phase input bit. Other weightings are possible such as a thermometer encoding or a segmented encoding may be used in alternative implementations. Nth current source 208 thus generates an Nth source signal $2^N*Iref$ that is $2^N$ times larger than a reference source signal Iref produced by zeroth current source 206. Similarly, a first source 207 generates a source signal $2*Iref$ that is 2 times larger than the zeroth source signal Iref. The in-phase input bits range from a zeroth in-phase input bit $b_0$ and its complement $\overline{b_0}$ to an Nth in-phase bit $b_N$ and its complement $\overline{b_N}$. A zeroth selector 209 in a plurality of selectors 210 includes a first switch controlled by zeroth input bit $b_0$ such that this first switch is closed if $b_0$ is true and open if $b_O$ is false. Similarly, zeroth selector 209 includes a second switch controlled by the complement bit $\overline{b_O}$ such that this second switch is closed if $\overline{b_0}$ is true and open if $\overline{b_0}$ is false. Each remaining selector is analogous in that it contains a first switch controlled by the corresponding in-phase input bit and a second switch controlled by the corresponding complement in-phase input bit. For example, a first selector 211 includes a first switch controlled by in-phase input bit $b_1$ and a second switch controlled by its complement $\overline{b_1}$ whereas an Nth selector 212 includes a first switch controlled by in-phase input bit $b_N$ and a second switch controlled by its complement $\overline{b_N}$. A summation network 215 includes a node for a positive component Iout+ of the in-phase analog output signal Iout that couples to the first switch in each selector. Similarly, summation network 215 includes a node for a negative component Iout of the in-phase analog output current that couples to the second switch in each selector. The in-phase analog output signal from implementation 200 of in-phase DAC 105 is thus a differential current signal Iout formed by Iout+ and Iout−. Although summation network 215 is passive, it may be weighted in alternative implementations.

The combination of each selector and summation network 215 is such that the differential output signal is driven with the corresponding source signal if the corresponding in-phase input bit is true. For example, zeroth selector 209 drives the positive component output signal Iout+ with the zeroth source signal $s_0$ (or a weighted version thereof) when the in-phase input bit $b_0$ is true. But if the in-phase input bit $b_0$ is false, then zeroth selector 209 drives the negative component output signal Iout− with the zeroth source signal $s_0$ (or a weighted version thereof). This is equivalent to driving the positive component Iout+ with the opposite ($-s_0$) of the zeroth source signal so. Referring again to in-phase DAC 105 of FIG. 1, the in-phase analog input signal $I_0$ from zeroth selector 101 is thus either the zeroth source signal $s_0$ or its complement $-s_0$. More generally, each selector in DACs 105 and 110 may also be denoted as a multiplexer that multiplexes either its source signal or its source signal's complement to the corresponding summation network depending upon the corresponding input bit.

Quadrature-phase DAC 110 may be implemented analogously as shown for implementation 200 of in-phase DAC 105 to produce the quadrature-phase analog output signal Qout. From DACs 105 and 110, the in-phase and quadrature-phase analog output signals may be frequency translated and combined to form a combined analog output signal (not illustrated) that may be amplified and transmitted. This combined analog signal results from the analog-to-digital conversion of the in-phase input bits and the quadrature-phase input bits. There is thus a zeroth analog signal that results from the digital-to-analog conversion of the zeroth in-phase and quadrature-phase bits, a first analog signal that results from the digital-to-analog conversion of the first in-phase and quadrature-phase bits, and so on such that there is an Nth analog signal that results from the digital-to-analog conversion of the Nth in-phase and quadrature-phase bits.

Figure 2B:
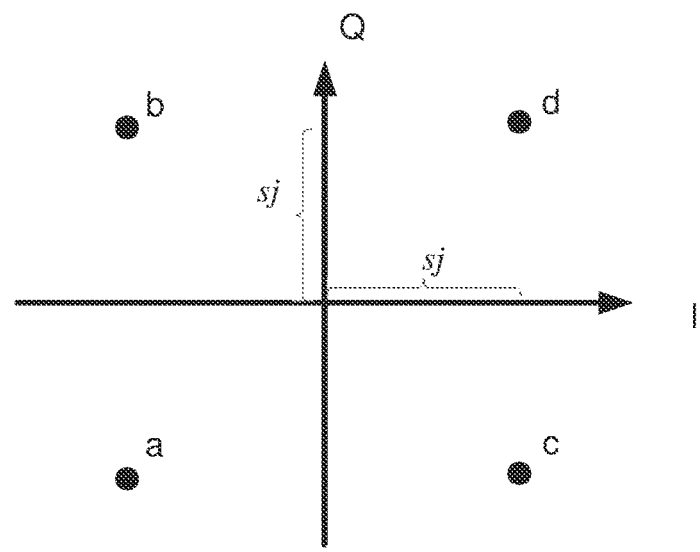
FIG. 2B illustrates the set of analog input signals to the summation network from a selector in the DAC system of FIG. 1 responsive to the conversion of the corresponding in-phase and quadrature phase-bit pair.

The combined analog output signal from the combination of the in-phase analog output signal Iout and the quadrature-phase analog output signal Qout thus results from a combination of the zeroth through the Nth analog signals. For example, a zeroth analog signal from DAC system 100 results from the combination of the zeroth in-phase analog input signal $I_0$ and the zeroth quadrature-phase input signal $Q_0$. The jth analog output signal resulting from the combination of the jth in-phase analog input signal $I_j$ and the jth quadrature-phase analog input signal $Q_j$ from DACs 105 and 110 is shown in the complex plane (I+jQ) in FIG. 2B, where j is an integer defined as (0≤j≤N). The jth analog output signal may be represented by a signal a when the jth input bit for both the in-phase digital input signal and the quadrature-phase digital input signal are both false. In particular, the jth selector in each of DACs 105 and 110 converts its jth input bit using a jth source signal $s_j$. Since the jth input bits are both false, signal a may be represented as $(-s_j, -s_j)$ in the (I, Q) analog output signal domain. If the jth quadrature-phase input bit is true and the jth in-phase input bit is false, an analog output signal b results that may be represented as $(-s_j, s_j)$. Conversely, if the jth quadrature-phase input bit is false and the jth in-phase input bit is true, an analog output signal c is produced that may be represented as $(s_j, -s_j)$. Finally, if the jth in-phase and quadrature-phase input bits are both true, an analog output signal d results that may be represented as $(s_j, s_j)$.

The jth analog output signal can thus have four possible values a through d whose dependence on the jth in-phase input bit $(i_j)$, the jth quadrature-phase input bit $(q_j)$ and relationship to the jth in-phase analog input signal $(I_j)$ and to the jth quadrature-phase analog input signal $(Q_j)$ is summarized in the following Table 1:

TABLE 1

|   | $i_j$ | $q_j$ | $I_j$ | $Q_j$ |
|---|---|---|---|---|
| a | 0 | 0 | $-s_j$ | $-s_j$ |
| b | 0 | 1 | $-s_j$ | $s_j$ |
| c | 1 | 0 | $s_j$ | $-s_j$ |
| d | 1 | 1 | $s_j$ | $s_j$ |

But such an ideal production of analog signals a through d requires the jth source in DACs 105 and 110 to be matched to each other so as to provide the same source signal. For example, the zeroth sources corresponding to zeroth selectors 101 and 141 must each produce zeroth source signal so, ideally without any error or mismatch. In reality, the signal sources have non-idealities that result in mismatches between the corresponding sources in DACs 105 and 110, which distorts the I/Q digital-to-analog conversion. In addition, the switching in each selector consumes power. Moreover, the noise from the jth source is DAC 105 is uncorrelated with the noise from the jth source in DAC 110. The noise power from these sources is thus doubled in the resulting analog output signal.

The single or combined I/Q DAC disclosed herein advantageously eliminates or reduces the source matching, power consumption, and noise issues associated with using separate I and Q DACs. The combined I/Q DAC may convert the same in-phase and quadrature-phase digital input signals as converted by dedicated I and Q DAC system 100. The resulting in-phase and quadrature-phase analog output signals from a combined I/Q DAC need not be equal to those produced by dedicated I and Q DAC system 100 but they should be proportional (assuming ideal behavior). For example, the in-phase and quadrature-phase analog output signals from a combined I/Q DAC may be frequency translated and combined to produce a combined analog output signal as discussed for dedicated I and Q DAC system 100. Assuming that the summation network is not weighted, the combined analog output signal from the single I/Q DAC equals a combination of the zeroth through the Nth analog output signals. A jth analog output signal from the combined I/Q DAC resulting from the conversion of the jth input bit pair $(i_j, q_j)$ may be deemed to result from a coordinate rotation of this jth input bit pair as compared to the production of the jth analog output signal for dedicated I and Q DAC system 100 as will be explained further herein.

Figure 3A:
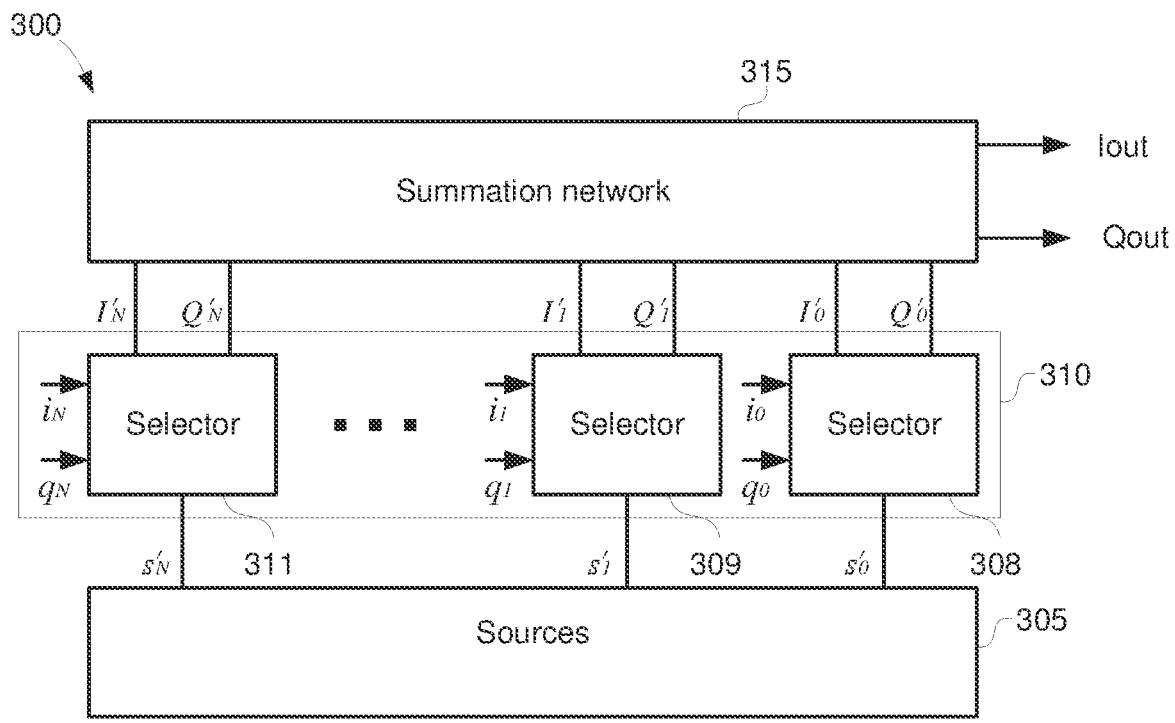
FIG. 3A illustrates a combined I/Q DAC in accordance with an aspect of the disclosure.

An example combined I/Q DAC 300 is shown in FIG. 3A. A plurality of sources 305 are analogous to sources 115 and 130. Sources 305 may comprise current sources, voltage sources, or charge sources. Each source generates a corresponding source signal. For example, a zeroth source generates a zeroth source signal $s_0'$, a first source generates a first source signal $s_1'$, and so on such that an Nth source generates an Nth source signal $s_N'$. Sources 305 are not shown separately in FIG. 3A for illustration clarity. Combined I/Q DAC 300 converts an in-phase digital input signal as well as a quadrature-phase digital input signal. Each of the digital input signals is (N+1) bits wide as discussed with regard to DACs 105 and 110. The in-phase digital input signal to combined I/Q DAC 300 ranges from a zeroth in-phase input bit $i_0$ to an Nth in-phase input bit $i_N$. Similarly, the quadrature-phase digital input signal to combined I/Q DAC 300 ranges from a zeroth quadrature-phase input bit $q_0$ to an Nth quadrature-phase input bit $q_N$. Sources 305 thus includes (N+1) individual sources, one for each pair of I and Q input bits.

DAC 300 includes selectors 310 for processing the source signals responsive to corresponding in-phase and quadrature-phase input bit pairs. Each source signal is processed by a corresponding selector. Selectors 310 thus range from a zeroth selector 308 that processes the zeroth source signal $s_0'$ responsive to the $i_0$ and $q_0$ input bit pair to a first selector 309 that processes the first source signal $s_1'$ responsive to an $i_1$ and $q_1$ input bit pair, and so on to an Nth selector 311 that processes the Nth source signal $s_N'$ responsive to the $i_N$ and $q_N$ bit pair. Depending upon its bit pair, a jth selector will drive either an analog in-phase input $I_j'$ or an analog quadrature-phase input $Q_j'$ to a summation network 315 with either the jth source signal or its complement. For example, zeroth selector 308 drives an analog in-phase input signal $I_0'$ and a quadrature-phase analog input signal $Q_0'$. Similarly, first selector 309 drives an in-phase analog input signal $I_1'$ and a quadrature-phase analog input signal $Q_1'$, and so on such that Nth selector 311 drives an in-phase analog input signal $I_N'$ and a quadrature-phase analog input signal $Q_N'$. Summation network 315 combines the in-phase analog input signals to form an in-phase analog output signal Iout and combines the quadrature-phase analog input signals to form a quadrature-phase analog output signal Qout.

Since each selector processes a single source signal into the corresponding in-phase analog input signal and quadrature-phase analog input signal to summation network 315, single I/Q DAC 300 does not suffer from a mismatch between in-phase and quadrature-phase DAC sources. In addition, single I/Q DAC 300 conserves switching power due to the use of each selector to process the corresponding source signal into the corresponding in-phase and quadrature-phase analog input signals to summation network 315. Moreover, single I/Q DAC 300 provides an improved signal-to-noise ratio in the combined analog output signal resulting from the combination of the analog in-phase and quadrature phase output signals Iout and Qout due to the single source that drives each selector. In other words, each pair of corresponding analog in-phase and quadrature-phase input signals (e.g., $I_0'/Q_0'$, $I_1'/Q_1'$, . . . and $I_N'/Q_N'$) results from the corresponding selector processing a single source signal. There is thus no adding of noise from separate sources as occurs in dedicated I and Q DAC system 100 in producing the comparable analog input signals.

Sources 305 and summation network 315 may be weighted (or not) depending upon the implementation. For example, summation network 315 may weight the in-phase analog input signals to form the in-phase analog output signal Iout and weight the quadrature-phase analog input signals to form the quadrature-phase analog output signal Qout. A convenient weighting for summation network 315 is a unitary weighting for each analog input signal (in-phase or quadrature-phase). Should each source be either a current source or a charge source, summation network 315 may be formed by connecting all the in-phase analog input signals to a node for the in-phase analog output signal Iout and connecting all the quadrature-phase analog input signals to a node for the quadrature-phase analog output signal Qout.

More generally, selectors 310 may be deemed to range from a least-significant selector (e.g., zeroth selector 308) to a most-significant selector (e.g., Nth selector 311). The weighting by summation network 315 may be responsive to the significance of the corresponding selector. For example, summation network 315 may be deemed to be configured to sum the in-phase analog input signals from selectors 310 to form the in-phase analog output signal Iout according to a summation network weighting progression from the least-significant selector to the most-significant selector and to sum the quadrature-phase analog input signals from the selectors 310 to form the quadrature-phase analog output signal Qout according to the summation network weighting progression.

Figure 3B:
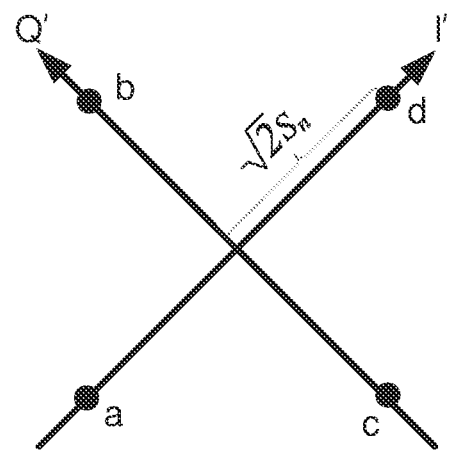
FIG. 3B illustrates the set of analog input signals to the summation network from a selector in a combined I/Q DAC responsive to the conversion of the corresponding in-phase and quadrature phase-bit pair.

A combined analog output signal formed by a combination of the in-phase analog output signal Iout and the quadrature-phase analog output signal Qout results from the digital-to-analog conversion of each pair of corresponding analog in-phase and quadrature-phase input bits (e.g., $i_0/q_0$, $i_1/q_1, \ldots$ and $i_N/q_N$). The combined analog output signal may thus be decomposed into a combination of a zeroth analog output signal from the conversion of the zeroth bit pair $i_0/q_0$, a first analog output signal from the conversion of the first bit pair $i_1/q_1$, and so on to an Nth analog output signal from the conversion of the Nth bit pair $i_N/q_N$. The conversion of the jth bit pair $i_j/q_j$, where j is an integer defined by ($0 \leq j \leq N$) will now be discussed with reference to FIG. 3B. As discussed previously, the conversion by combined I/Q DAC 300 of the jth input bit pair should be proportional to the conversion by dedicated I and Q DAC system 100 of the same jth input bit pair, assuming ideal behavior. With the proper weighting of the source signals, the conversion of the jth input bit pair by combined I/Q DAC 300 is equal to the conversion by dedicated I and Q DAC system 100 (again assuming ideal behavior). Combined I/Q DAC 300 may thus convert the jth input bit pair into a jth analog output signal equaling signals a, b, c, and d, depending upon the digital value of the jth input bit pair. But the coordinate system for the resulting in-phase and quadrature-phase analog input signals $I'_j$ and $Q'_j$ is rotated with respect to the in-phase and quadrature-phase coordinate system of FIG. 2B. This rotation may be deemed to be a rotation of +/−45 degrees (or equivalently, one of +/−135 degrees, +/−225 degrees, +/−315 degrees, and so on. For example, the jth selector drives the in-phase analog input signal $I'_j$ to summation network 315 (assuming a unitary weighting in summation network 315) with the complement ($-s'_j$) of the jth source signal when the jth input bit pair ($i'_j$, $q'_j$) is (0, 0). As seen in FIG. 3B, the output signal a is thus only expressed on the in-phase analog input signal I' coordinate system axis. Conversely, the jth selector drives the quadrature-phase analog input signal $Q'_j$ with the source signal $s'_j$ when the jth input bit pair equal (0, 1). In this case, the output signal b is expressed only on the quadrature-phase analog input signal Q' coordinate system axis. Should the jth input bit pair equal (1,0), the quadrature-phase analog input signal $Q'_j$ becomes the complement $-s'_j$. Finally, if the jth input bit equals (1,1), the in-phase analog input signal $I'_j$ becomes the jth source signal $s'_j$. Comparing FIGS. 2B and 3B, signals a through d are equal for both a dedicated or combined DAC architecture if the jth source signal $s'_j$ for combined I/Q DAC 300 is a square root of 2 times larger than the jth source signal $s_j$ for dedicated I and Q DAC system 100.

The conversion of the jth input bit pair by combined I/Q DAC 300 may be summarized in the following Table 2:

TABLE 2

|   | $i_j$ | $q_j$ | $I'_j$ | $Q'_j$ |
|---|---|---|---|---|
| a | 0 | 0 | $-s'_j$ | 0 |
| b | 0 | 1 | 0 | $s'_j$ |
| c | 1 | 0 | 0 | $-s'_j$ |
| d | 1 | 1 | $s'_j$ | 0 |

It may be appreciated from a consideration of Table 2 and combined I/Q DAC 300 that a combined I/Q DAC as disclosed herein includes a plurality of selectors corresponding to a plurality of in-phase and quadrature-phase input bit pairs. For example, the jth selector corresponds to the ($i_j$, $q_j$) input bit pair. In addition, a combined I/Q DAC as disclosed herein includes a plurality of sources corresponding to the plurality of selectors, wherein each selector is configured to convert a source signal from the corresponding source into an in-phase analog input signal and a quadrature-phase analog input signal responsive to the corresponding in-phase and quadrature-phase input bit pair. For example, the conversion of the jth source signal by the jth selector into the jth in-phase and quadrature-phase analog input signals responsive to the jth bit pair ($i_j$, $q_j$) is summarized in Table 2.

Figure 4:
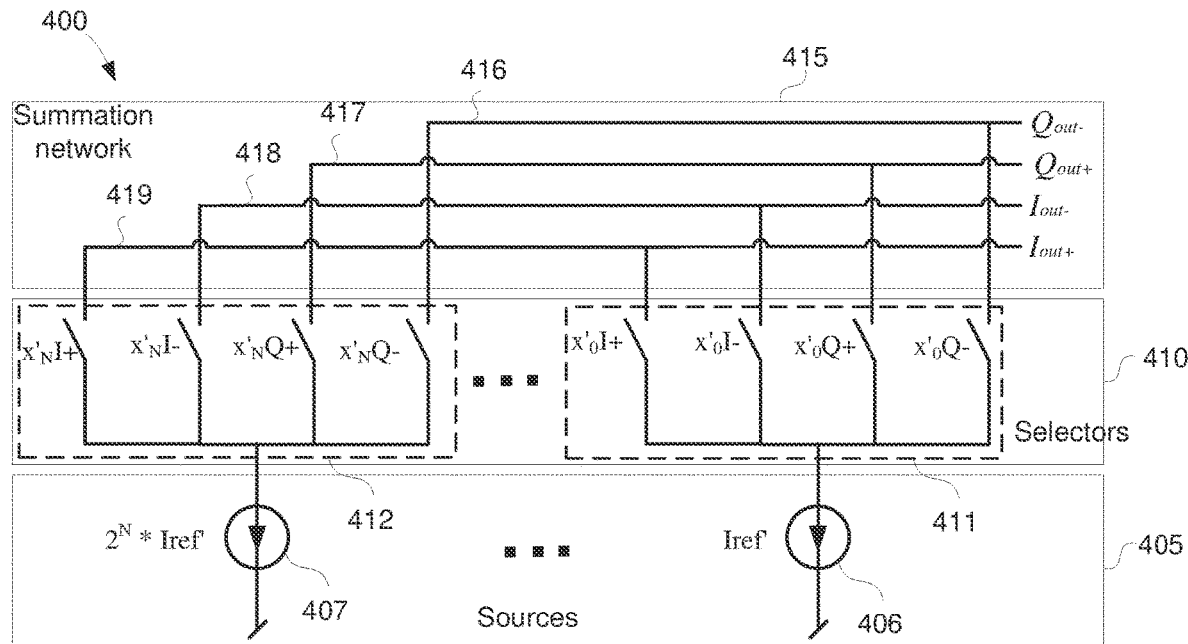
FIG. 4 is a circuit diagram of an example combined I/Q DAC in which the summation network provides a unitary weighting in accordance with an aspect of the disclosure.

As discussed for dedicated I and Q DAC system 100, a convenient weighting for summation network 315 is a unitary weighting. A combined I/Q DAC 400 with a unitary weighted summation network 415 is shown in FIG. 4. As discussed for combined I/Q DAC 300, combined I/Q DAC 400 converts an (N+1) bit-wide in-phase digital input signal as well as an (N+1) bit-wide quadrature-phase digital input signal. Combined I/Q DAC 400 thus includes a plurality of (N+1) sources 405 ranging from a zeroth source 406 to an Nth source 407. Sources 405 are binary weighted although other weightings (or combinations of other weightings) may be used in alternative implementations. For example, a first subset of sources may be binary weighted while a second subset of sources are unitary weighted in an alternative implementation. Sources 405 are current sources but may be charge or voltage sources in alternative implementations. Zeroth source 406 generates a zeroth source current Iref whereas Nth source 407 generates a source current that is $2^N$ times larger. Zeroth source 406 may also be designated as a least-significant source whereas Nth source 407 may be denoted as a most-significant source. A binary weighting progression extends from the least-significant source to the most-significant source. Each successive source in the binary weighting progression weights its source signal according to a binary weight that is twice the weight of a preceding source in the binary weighting progression.

The use of current sources in sources 405 allows summation network 415 to be formed by four nodes. An in-phase analog output signals Iout+ conducts on a first node 419 whereas an in-phase analog output signal Iout− conducts on a second node 418. Iout+ is the positive component of the in-phase analog output signal whereas Iout− is the negative component. Similarly, a quadrature-phase analog output signals Qout+ conducts on a third node 417 whereas a quadrature-phase analog output signal Qout− conducts on a fourth node 416. Qout+ is the positive component of the quadrature-phase analog output signal whereas Qout− is the negative component. In an alternative single-ended implementation, summation network 415 may instead have just two nodes for an in-phase analog output signal Iout and a quadrature-phase analog output signal Qout, respectively as shown in FIG. 3A.

Combined I/Q DAC 400 includes a plurality of (N+1) selectors 410 ranging from a zeroth selector 411 to an Nth selector 412. Zeroth selector 411 converts the zeroth bit pair $i_0/q_0$ as discussed for zeroth selector 308. Similarly, Nth selector 412 converts the Nth bit pair $i_N/q_N$ as discussed for Nth selector 311. But due to the coordinate system rotation, a jth bit pair $i_j/q_j$ is transformed into a set of rotated bits including a bit pair $x'_jI+/x'_jQ+$ and a complement bit pair $x'_jI-/x'_jQ-$. For example, the zeroth bit pair $i_0/q_0$ is transformed into four rotated input bits $x'_0I+$, $x'_0I-$, $x'_0Q+$, and $x'_0Q-$. Similarly, the Nth bit pair $i_N/q_N$ is transformed into four rotated input bits $x'_NI+$, $x'_NI-$, $x'_NQ+$, and $x'_NQ-$. Each selector includes a plurality of switches. For example, each selector may include a set of four switches, one for each rotated input bit. Thus, zeroth selector 411 includes a first switch coupled between zeroth source 406 and first node 419 that closes when the rotated input bit $x'_0I+$ is true and is open otherwise. Similarly, zeroth selector 411 includes a second switch coupled between zeroth source 406 and second node 418 that closes when the rotated input bit $x'_0I-$ is true and is open otherwise. In addition, zeroth selector 411 includes a third switch coupled between zeroth source 406 and third node 417 that closes when the rotated input bit $x'_0Q+$ is true and is open otherwise. Finally, zeroth selector 411 includes a fourth switch coupled between zeroth source 406 and fourth node 416 that closes when the rotated input bit $x'_0Q-$ is true and is open otherwise. Each remaining selector has four analogous switches. For example, Nth selector 412 includes a first switch coupled between Nth source 407 and first node 419 that closes when the rotated input bit $x'_NI+$ is true and is open otherwise. Similarly, Nth selector 412 includes a second switch coupled between Nth source 407 and second node 418 that closes when the rotated input bit $x'_NI-$ is true and is open otherwise. In addition, Nth selector 412 includes a third switch coupled between Nth source 407 and third node 417 that closes when the rotated input bit $x'_NQ+$ is true and is open otherwise. Finally, Nth selector 412 includes a fourth switch coupled between Nth source 407 and fourth node 416 that closes when the rotated input bit $x'_NQ-$ is true and is open otherwise.

Figure 5:
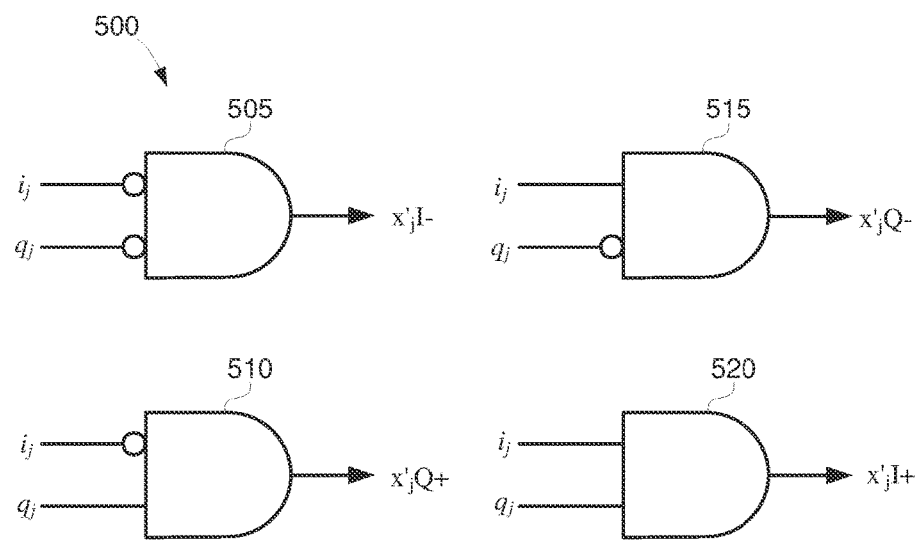
FIG. 5 illustrates an example logic circuit for the rotation of an in-phase and quadrature-phase bit pair into a rotated bit pair for the combined I/Q DAC of FIG. 4 in accordance with an aspect of the disclosure.

Any suitable logic circuit may be used to rotate each input bit pair to the set of four corresponding rotated input bits. An example logic circuit 500 is shown in FIG. 5 for the rotation of the jth input bit pair into the four rotated input bits $x'_jI+$, $x'_jI-$, $x'_jQ+$, and $x'_jQ-$. Logic circuit 500 may also be deemed to transform the jth input bit pair such that bits $x'_jI+$, $x'_jI-$, $x'_jQ+$, and $x'_jQ-$ may also be denoted as transformed bits. An AND gate 505 produces rotated input bit $x'_jI-$ by ANDing a complement of input bit $i_j$ with a complement of input bit $q_j$. Similarly, an AND gate 510 produces rotated input bit $x'_jQ+$ by ANDing a complement of input bit $i_j$ with input bit $q_j$. An AND gate 515 produces rotated input bit $x'_jQ-$ by ANDing input bit $i_j$ with a complement of input bit $q_j$. Finally, an AND gate 520 produces rotated input bit $x'_jI+$ by ANDing input bit $i_j$ with input bit $q_j$. The resulting rotation of the jth input bit pair is summarized in the following Table 3;

TABLE 2

| $i_j$ | $q_j$ | $x'_jI+$ | $x'_jI-$ | $x'_jQ+$ | $x'_jQ-$ |
|---|---|---|---|---|---|
| 0 | 0 | 0 | 1 | 0 | 0 |
| 0 | 1 | 0 | 0 | 1 | 0 |
| 1 | 0 | 0 | 0 | 0 | 1 |
| 1 | 1 | 1 | 0 | 0 | 0 |

For any given digital value for the jth input bit pair $(i_j/q_j)$, only one of the four switches in the corresponding jth selector is closed to produce the a, b, c, and d possible outcomes discussed regarding FIG. 3B. For example, only the rotated input bit $x'_jI-$ is true when the jth input bit pair $i_j/q_j$ has the digital value (0, 0). Thus, only the second switch in the jth selector will be closed to couple the jth source signal to second node 418 in response to this (0,0) input bit pair. The first, third, and fourth switches are open. Similarly, only the rotated input bit $x'_jI+$ is true when the jth input bit pair $i_j/q_j$ has the digital value (1,1). Thus, only the first switch in the jth selector will be closed to couple the jth source signal to first node 419 in response to this (1,1) input bit pair. The second, third, and fourth switches are open. Should the jth input bit pair be equal (0,1), only the rotated input bit $x'_jQ+$ is true. Thus, only the third switch in the jth selector will be closed to couple the jth source signal to third node 417 in response to this (0,1) input bit pair. The first, second, and fourth switches are open. Finally, only the rotated input bit $x'_jQ-$ is true if the jth input bit pair equals (1,0). Thus, only the fourth switch in the jth selector will be closed to couple the jth source signal to fourth node 416 in response to this (1,0) digital value. The first, second, and third switches are open.

Figure 6:
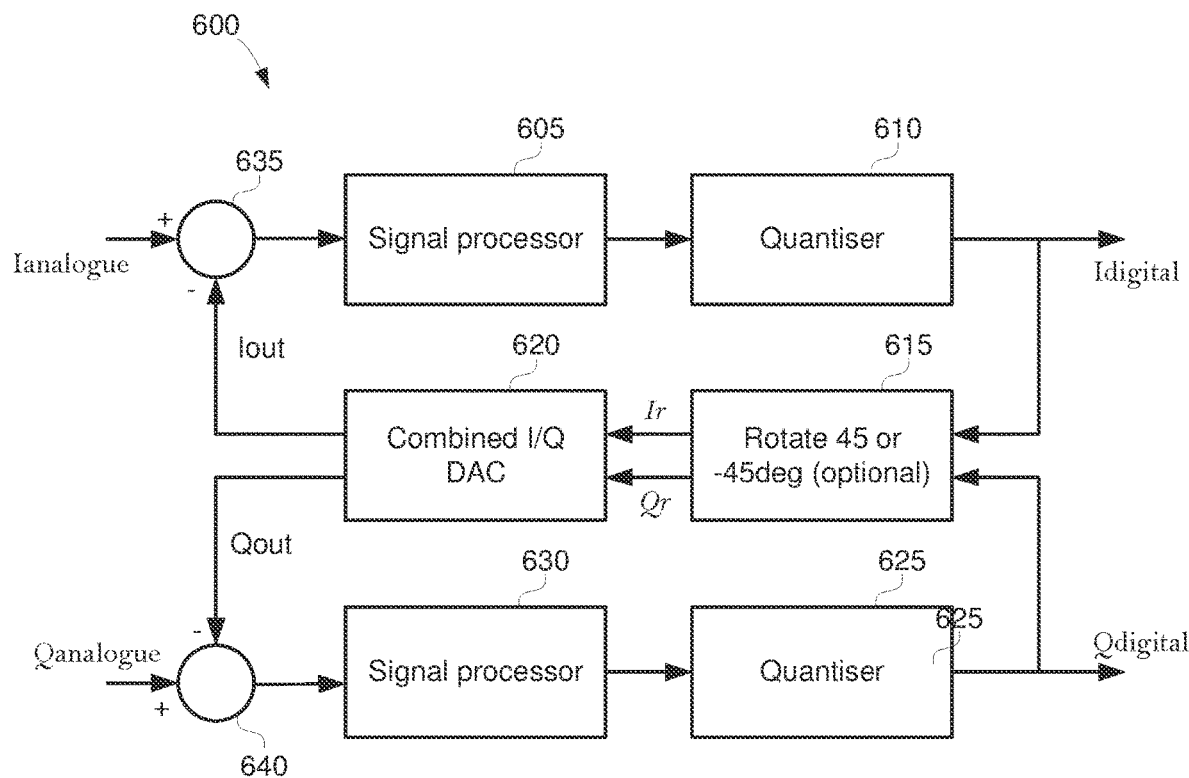
FIG. 6 illustrates a sigma-delta analog-to-digital converter including a combined I/Q DAC as the feedback DAC in accordance with an aspect of the disclosure.

Various signal processing systems may advantageously include a combined I/Q DAC. In one example, a combined I/Q DAC as disclosed herein may be advantageously incorporated in an analog-to-digital converter (ADC) that uses a digital-to-analog converter. Other examples in the context of a transmit chain are described below. A sigma-delta ADC is an example of an ADC using a DAC. A dedicated I and Q DAC topology may be used to implement the DAC using a dedicated I and Q DAC topology, but this raises the source matching, power consumption, and noise issues discussed earlier. To address these issues, an example sigma-delta ADC 600 with a combined I/Q DAC 620 implementing the feedback DAC is shown in FIG. 6. An in-phase analog signal Ianalogue is summed at an adder 635 with the in-phase analog output signal Iout from combined I/Q DAC 620. A signal processor 605 such as an integrator or resonator with a relatively high gain at the frequencies of interest for the digitization processes a summed signal from adder 635 to form a processed signal that is quantized in a quantizer 610 to form an in-phase digital output signal Idigital. Similarly, a quadrature-phase analog signal Qanalogue is summed at an adder 640 with the quadrature-phase analog output signal Qout from combined I/Q DAC 620. A signal processor 630 such as an integrator or resonator with a relatively high gain at the frequencies of interest for the digitization processes a summed signal from adder 640 to form a processed signal that is quantized in a quantizer 625 to form a quadrature-phase digital output signal Qdigital. To address the +/−45 degree phase rotation from combined I/Q DAC 620, a logic circuit 615 may rotate the digital output signals Idigital and Qdigital to form a rotated in-phase digital input signal $I_r$ and a rotated quadrature-phase digital input signal $Q_r$ to combined I/Q DAC 620. However, omitting logic circuit 615 may be advantageous in improving the phase margin for ADC 600.

Figure 7:
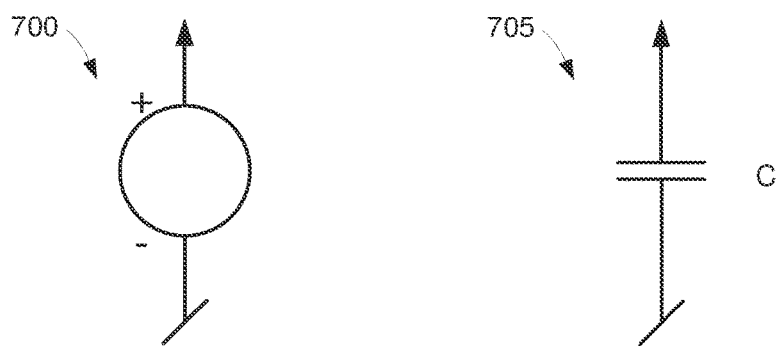
FIG. 7 illustrates an example voltage source and example charge source for a combined I/Q DAC in accordance with an aspect of the disclosure.

As discussed previously, the sources in a combined I/Q DAC may be current sources, charge sources, or voltage sources. An example voltage source 700 providing a voltage signal is shown in FIG. 7. In addition, FIG. 7 illustrates a capacitor C 705 that functions as an example charge source providing a charge signal.

Figure 8:
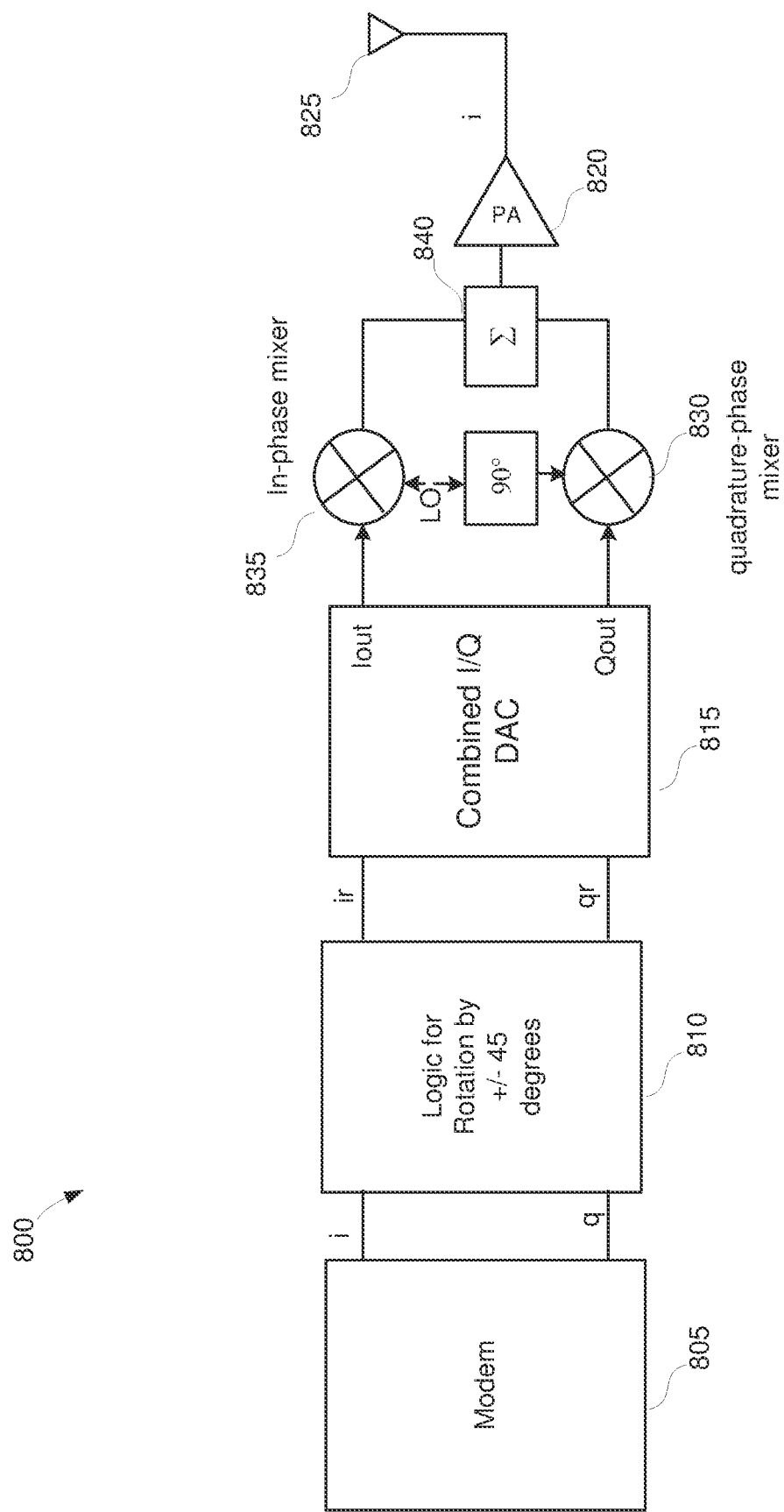
FIG. 8 illustrates a transmitter including a combined I/Q DAC in accordance with an aspect of the disclosure.

For example. a transmitter 800 illustrated in FIG. 8 includes a combined I/Q DAC 815. A modem 805 generates the in-phase and quadrature-phase digital input signals i and q. An optional logic circuit 810 rotates the digital input signals by +/−45 degrees to form rotated digital input signals $i_r$ and $q_r$ for combined I/Q DAC 815. The in-phase analog output signal I from combined I/Q DAC 815 is mixed with a local oscillator (LO) signal in an in-phase mixer 835. Similarly, the LO is phase-shifted by 90 degrees to be mixed in a quadrature-phase mixer 830 with the quadrature-phase analog output signal Q from combined I/Q DAC 815. The analog radio frequency (RF) output signals from mixers 835 and 830 are combined to form a combined analog RF output signal in a combiner 840. A power amplifier (or amplifiers) 820 amplifies the combined analog RF output signal so that it may be transmitted over an antenna 825 (which may be an antenna array). It will be appreciated that that various filters and other desirable signal processing elements in transmitter 800 are not shown for illustration clarity.

Figure 9:
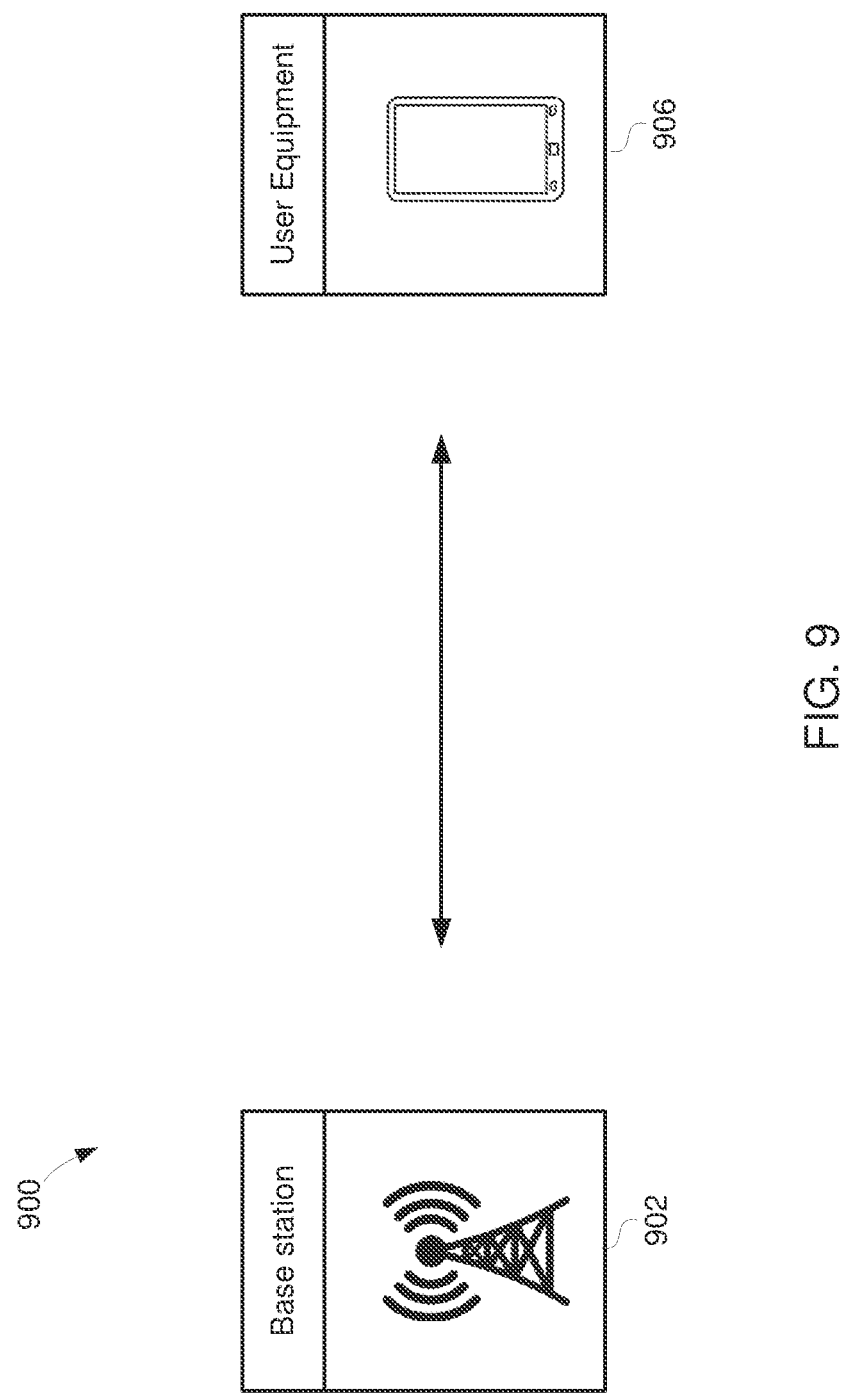
FIG. 9 illustrates an example wireless communication system in which one or more transmitters include a combined I/Q DAC in accordance with an aspect of the disclosure.

A transmitter with a combined I/Q DAC may be advantageously incorporated into a variety of wireless communication systems. An example a system 900 including a base station 902 and a user equipment 906 is shown in FIG. 9. Both base station 902 and user equipment 906 may include a transceiver or transmitter including a combined I/Q DAC as disclosed herein. System 900 may practice a wide variety of wireless communication protocols such as Long Term Evolution or Fifth Generation New Radio, WLAN systems, and the like.

Figure 10:
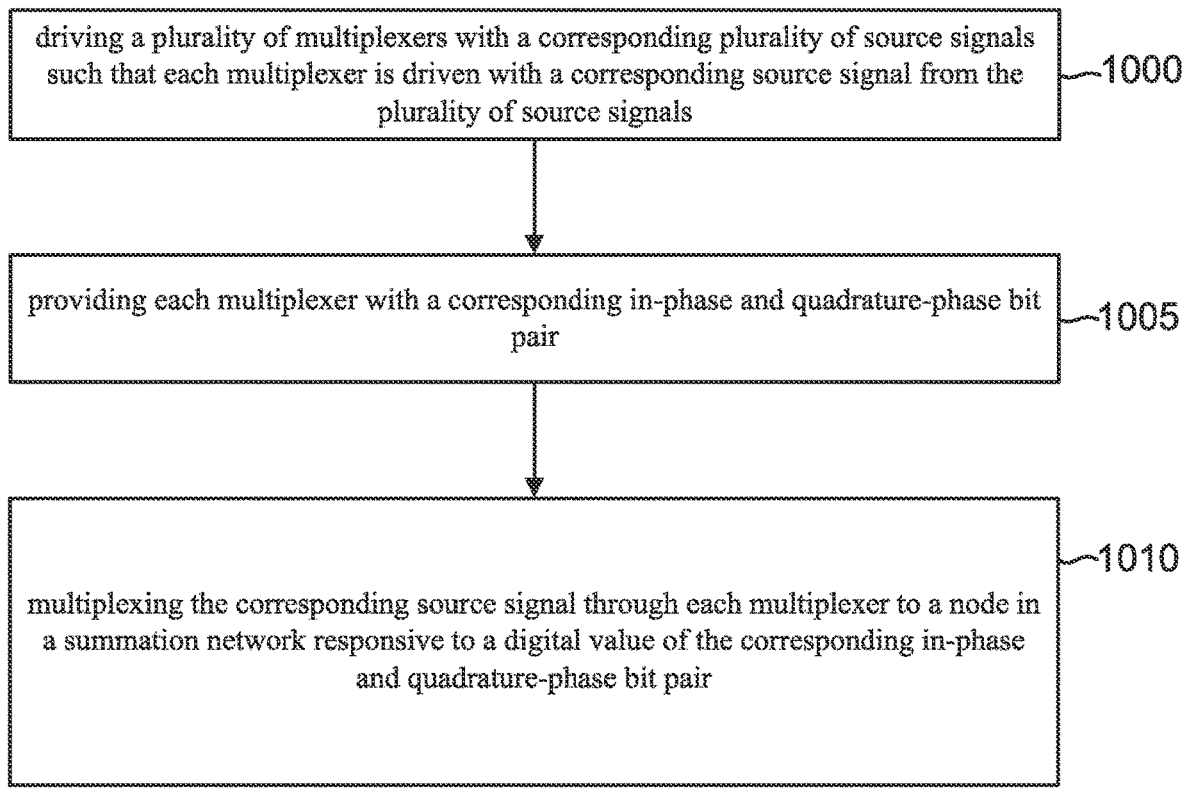
FIG. 10 is a flowchart for an example method of operation for a combined I/Q DAC in accordance with an aspect of the disclosure.

A method of operation for a combined I/Q DAC will now be discussed for the flowchart of FIG. 10. The method includes an act 1000 of driving a plurality of multiplexers with a corresponding plurality of source signals such that each multiplexer is driven with a corresponding source signal from the plurality of source signals. The driving of each selector in combined I/Q DACs 300 and 400 with the corresponding source signal is an example of act 1000. The method also includes an act 1005 of providing each multiplexer with a corresponding in-phase and quadrature-phase bit pair. The provision of the jth bit pair ($i_j$, $q_j$) to the jth selector in DAC 300 is an example of act 1005. Finally, the method includes an act 1010 of multiplexing the corresponding source signal through each multiplexer to a node in a summation network responsive to a digital value of the corresponding in-phase and quadrature-phase bit pair. The routing through each selector in combined I/Q DACs 300 and 400 is an example of act 1010.

Figure 11:
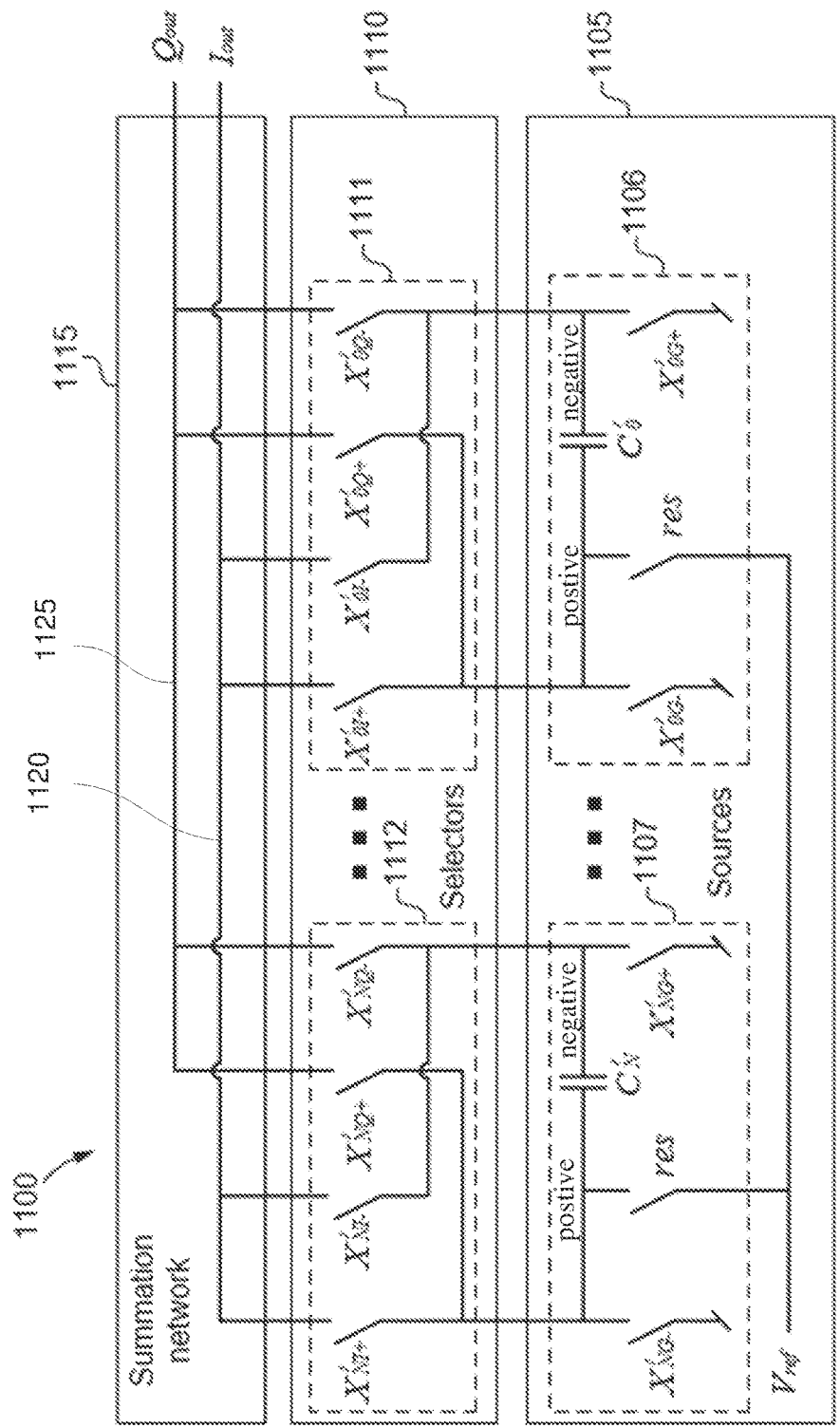
FIG. 11 is a circuit diagram of an example single-ended capacitive I/Q DAC in accordance with an aspect of the disclosure.

An example single-ended capacitive I/Q DAC 1100 is shown in FIG. 11. As discussed for combined I/Q DAC 300, I/Q DAC 1100 converts an in-phase digital input signal as well as a quadrature-phase digital input signal. Each of the digital input signals is (N+1) bits wide as discussed regarding DACs 105 and 110. The in-phase digital input signal to I/Q DAC 1100 thus ranges from a zeroth in-phase input bit $i_0$ to an Nth in-phase input bit $i_N$. Similarly, the quadrature-phase digital input signal to I/Q DAC 1100 ranges from a zeroth quadrature-phase input bit $q_0$ to an Nth quadrature-phase input bit $q_N$.

A plurality of charge sources 1105 includes (N+1) individual charge sources, one for each pair of I and Q input bits ranging from a zeroth charge source 1106 to an Nth charge source 1107. Each charge source drives a corresponding selector in a plurality of selectors 1110 arranged from a zeroth selector 1111 to an Nth selector 1112. For example, zeroth charge source 1106 drives zeroth selector 1111 whereas Nth charge source 1107 drives Nth selector 1112.

Zeroth selector 1111 converts the zeroth bit pair $i_0/q_0$ as discussed for zeroth selector 411. Similarly, Nth selector 1112 converts the Nth bit pair $i_N/q_N$ as discussed for Nth selector 412. Due to the coordinate system rotation, a jth bit pair $i_j/q_j$ is transformed into a set of rotated bits (which may also be denoted as transformed bits) including a bit pair $x'_jI+/x'_jQ+$ and a complement bit pair $x'_jI-/x'_jQ-$. For example, the zeroth bit pair $i_0/q_0$ is transformed into four rotated input bits $x'_0I+$, $x'_0I-$, $x'_0Q+$, and $x'_0Q-$. Similarly, the Nth bit pair $i_N/q_N$ is transformed into four rotated input bits $x'_NI+$, $x'_NI-$, $x'_NQ+$, and $x'_NQ-$.

Each charge source includes a capacitor having a positive plate and a negative plate. For example, zeroth charge source 1106 includes a capacitor $C'_0$. Similarly, Nth charge source 1107 includes a capacitor $C'N$. A summation network 1115 includes a node 1120 for a single-ended in-phase output signal Iout and a node 1125 for a single-ended quadrature-phase output signal Qout. Each selector couples between the positive and negative plate of the capacitor in the corresponding charge source and nodes 1120 and 1125 in summation network 1115. For example, zeroth selector 1111 includes a first switch coupled between the positive plate of capacitor Co' and node 1120, a second switch coupled between the negative plate of capacitor Co' and node 1120, a third switch coupled between the positive plate of capacitor Co' and node 1125, and a fourth switch coupled between the negative plate of capacitor Co' and node 1125. Each remaining selector has four analogous switches. For example, Nth selector 1112 includes a first switch coupled between a positive plate of capacitor C'N and node 1120, a second switch coupled between a negative plate of capacitor C'N and node 1120, a third switch coupled between the positive plate of capacitor C'N and node 1125, and a fourth switch coupled between the negative plate of capacitor C'N and node 1125.

A jth selector thus has a first and second switch for node 1120 (for output signal Iout). The first switch couples to the positive plate of the capacitor in the jth charge source whereas the second switch couples to the negative plate of that capacitor. The first switch closes when a corresponding rotated bit $x'_jI+$ is true and is open otherwise. Similarly, the second switch closes when a corresponding rotated bit $x'_jI-$ is true and is open otherwise. For example, the first switch in zeroth selector 1111 closes when input bit $x'_0I+$ is true. Similarly, the first switch in Nth selector 1112 closes when input bit $x'_NI+$ is true. The second switch in zeroth selector 1111 closes when input bit $x'_0I-$ is true whereas the second switch in Nth selector 1112 closes when input bit $x'_NI-$ is true.

A jth selector also has a third and fourth switch for node 1125 (for output signal Qout). The third switch couples to the positive plate of the capacitor in the jth charge source whereas the fourth switch couples to the negative plate of that capacitor. The third switch closes when a corresponding rotated bit $x'_jQ+$ is true and is open otherwise. Similarly, the fourth switch closes when a corresponding rotated bit $x'_jQ-$ is true and is open otherwise. For example, the third switch in zeroth selector 1111 closes when input bit $x'_0Q+$ is true. Similarly, the third switch in Nth selector 1112 closes when input bit $x'_NQ+$ is true. The fourth switch in zeroth selector 1111 closes when input bit $x'_0Q-$ is true whereas the fourth switch in Nth selector 1112 closes when input bit $x'_NQ-$ is true.

Prior to the digitization of the input bit pairs, each capacitor is charged to a reference voltage Vref. For example, each charge source may include a reset (res) switch that couples between a node for the reference voltage Vref and the positive plate of the corresponding capacitor. The closing of the reset switches charges the charge source capacitors to the reference voltage Vref. The capacitance of the capacitors may be weighted according to a binary weighting progression. Alternatively, a unitary weighting may be used or a combination of binary and unitary weighting.

I/Q DAC 1100 is readily modified to use current sources instead of charge sources. Each current source would include a positive current source that couples to the first switch and to the third switch in the corresponding selector and a negative current source that couples to the second switch and to the fourth switch. Regardless of whether an I/Q DAC as disclosed herein is differential or single-ended and regardless of the source type (current source, charge source, voltage source, and so on), the resulting I/Q DAC may be deemed to include: a plurality of selectors corresponding to a plurality of in-phase and quadrature-phase bit pairs, each selector being configured to receive a corresponding in-phase and quadrature-phase bit pair from the plurality of in-phase and quadrature-phase bit pairs; and a plurality of sources corresponding to the plurality of selectors, wherein each selector is configured to convert a source signal from a corresponding source from the plurality of sources into an in-phase analog input signal and a quadrature-phase analog input signal responsive to the corresponding in-phase and quadrature-phase bit pair. For example, the source signal from each charge source in IQ DAC 1100 may be the positive plate or the negative plate of the corresponding capacitor, depending upon the state of the corresponding input bit pair.

Some aspects of the disclosure will now be summarized in the following example clauses:

Clause 1. A combined in-phase and quadrature-phase digital-to-analog converter comprising:

a plurality of selectors corresponding to a plurality of in-phase and quadrature-phase bit pairs, each selector being configured to receive a corresponding in-phase and quadrature-phase bit pair from the plurality of in-phase and quadrature-phase bit pairs;

a plurality of sources corresponding to the plurality of selectors, wherein each selector is configured to convert a source signal from a corresponding source from the plurality of sources into an in-phase analog input signal and a quadrature-phase analog input signal responsive to the corresponding in-phase and quadrature-phase bit pair; and a summation network configured to sum the in-phase analog input signals from each selector in the plurality of selectors to form an in-phase analog output signal and to sum the quadrature-phase analog input signals from each selector in the plurality of selectors to form a quadrature-phase analog output signal.

Clause 2. The combined in-phase and quadrature-phase digital-to-analog converter of clause 1, wherein the plurality of sources is arranged from a least-significant source to a most-significant source, and wherein each source in the plurality of sources is configured to provide a binary weight to its source signal according to a binary weighting progression from the least-significant source to the most-significant source.

Clause 3. The combined in-phase and quadrature-phase digital-to-analog converter of clause 1, wherein each source in the plurality of sources is configured to provide a unitary weight to its source signal.

Clause 4. The combined in-phase and quadrature-phase digital-to-analog converter of clause 1, wherein a first subset of sources in the plurality of sources is arranged from a least-significant source to a most-significant source, and wherein each source in the first subset of sources is configured to provide a binary weight to its source signal according to a binary weighting progression from the least-significant source to the most-significant source, and wherein each source in a second subset of the sources in the plurality of sources is configured to provide a unitary weight to its source signal.

Clause 5. The combined in-phase and quadrature-phase digital-to-analog converter of any of clauses 1-4, wherein each source is a current source, and wherein the source signal from each source is a current signal.

Clause 6. The combined in-phase and quadrature-phase digital-to-analog converter of any of clauses 1-4, wherein each source is a charge source, and wherein the source signal from each source is a charge signal.

Clause 7. The combined in-phase and quadrature-phase digital-to-analog converter of any of clauses 1-4, wherein each source is a voltage source, and wherein the source signal from each source is a voltage signal.

Clause 8. The combined in-phase and quadrature-phase digital-to-analog converter of clause 4, wherein the summation network is configured to sum the in-phase analog input signals from each selector in the plurality of selectors to form the in-phase analog output signal according to a summation network weighting progression from a least-significant selector to a most-significant selector and to sum the quadrature-phase analog input signals from each selector in the plurality of selectors to form the quadrature-phase analog output signal according to the summation network weighting progression.

Clause 9. The combined in-phase and quadrature-phase digital-to-analog converter of clause 8, wherein the summation network weighting progression is a unitary weighting.

Clause 10. The combined in-phase and quadrature-phase digital-to-analog converter of any of clauses 1-9, wherein the combined in-phase and quadrature-phase digital-to-analog converter is included in an analog-to-digital converter.

Clause 11. The combined in-phase and quadrature-phase digital-to-analog converter of clause 10, wherein the analog-to-digital converter is a sigma-delta analog-to-digital converter.

Clause 12. The combined in-phase and quadrature-phase digital-to-analog converter of any of clauses 1-11, further comprising:

a logic circuit configured to rotate each in-phase and quadrature-phase bit pair into a rotated bit pair, wherein each selector is configured to convert the source signal from the corresponding source into the in-phase analog input signal and the quadrature-phase analog input signal responsive to the rotated bit pair from a rotation of the corresponding in-phase and quadrature-phase bit pair.

Clause 13. The combined in-phase and quadrature-phase digital-to-analog converter of clause 1, wherein each selector comprises a plurality of switches.

Clause 14. The combined in-phase and quadrature-phase digital-to-analog converter of clause 1, wherein each selector in the plurality of selectors comprises a set of four switches coupled between the corresponding source and the summation network.

Clause 15. The combined in-phase and quadrature-phase digital-to-analog converter of any of clauses 1-14, wherein the combined in-phase and quadrature-phase digital-to-analog converter is incorporated in a transmitter in a user equipment.

Clause 16. A method of operation for a combined I/Q DAC, comprising:
  driving a plurality of multiplexers with a corresponding plurality of source signals such that each multiplexer is driven with a corresponding source signal from the plurality of source signals;
  providing each multiplexer with a corresponding in-phase and quadrature-phase bit pair; and
  multiplexing the corresponding source signal through each multiplexer to a node in a summation network responsive to a digital value of the corresponding in-phase and quadrature-phase bit pair.

Clause 17. The method of operation of clause 16, wherein multiplexing the corresponding source signal through each multiplexer comprises:
  routing the corresponding source signal to a first node in the summation network responsive to a first digital value of the corresponding in-phase and quadrature-phase bit pair; and
  routing the corresponding source signal to a second node in the summation network responsive to a second digital value of the corresponding in-phase and quadrature-phase bit pair.

Clause 18. The method of operation of clause 16, further comprising:
  rotating each corresponding in-phase and quadrature-phase bit pair to form a set of rotated input bits so that for each digital value only one of the rotated input bits in the set of rotated bits has a binary true value, wherein multiplexing the corresponding source signal through each multiplexer comprises routing the corresponding source signal to the node responsive to the rotated input bit having the binary true value.

Clause 19. The method of operation of any of clauses 17-18, wherein multiplexing the corresponding source signal through each multiplexer further comprises:
  routing the corresponding source signal to a third node in the summation network responsive to a third digital value of the corresponding in-phase and quadrature-phase bit pair; and
  routing the corresponding source signal to a fourth node in the summation network responsive to a fourth digital value of the corresponding in-phase and quadrature-phase bit pair.

Clause 20. A digital-to-analog converter, comprising:
  a summation network including a plurality of nodes for an in-phase analog output signal and a quadrature-phase analog output signal;
  a plurality of sources; and
  a plurality of multiplexers corresponding to the plurality of sources, each multiplexer having a corresponding source from the plurality of sources and being configured to multiplex a source signal from the corresponding source to a corresponding node from the plurality of nodes responsive to a digital value of a corresponding in-phase and quadrature-phase bit pair.

Clause 21. The digital-to-analog converter of clause 20, wherein the plurality of nodes comprises:
  a first node for a positive component of the in-phase analog output signal;
  a second node for a negative component of the in-phase analog output signal;
  a third node for a positive component of the quadrature-phase analog output signal; and
  a fourth node for a negative component of the quadrature-phase analog output signal.

Clause 22. The digital-to-analog converter of clause 20, wherein each multiplexer comprises:
  a first switch coupled between the corresponding source and the first node;
  a second switch coupled between the corresponding source and the second node;
  a third switch coupled between the corresponding source and the third node; and
  a fourth switch coupled between the corresponding source and the fourth node.

Clause 23. The digital-to-analog converter of any of clauses 20-22, wherein each source is a current source.

Clause 24. The digital-to-analog converter of any of clauses 20-22, wherein each source is a voltage source.

Clause 25. The digital-to-analog converter of any of clauses 20-22, wherein each source is a charge source.

Clause 26. The digital-to-analog converter of claim 22, further comprising:
  a logic circuit configured to transform each corresponding in-phase and quadrature-phase bit pair into a corresponding set of transformed bits, wherein each multiplexer is configured to close its first switch responsive to a first bit in the corresponding set of transformed bits being true while a second bit, a third bit, and a fourth bit in the corresponding set of transformed bits are false.

Clause 27. The digital-to-analog converter of clause 26, wherein each multiplexer is configured to close its second switch responsive to the second bit in the corresponding set of transformed bits being true while the first bit, the third bit, and the fourth bit in the corresponding set of transformed bits are false.

Clause 28. The digital-to-analog converter of clause 27, wherein each multiplexer is configured to close its third switch responsive to the third bit in the corresponding set of transformed bits being true while the first bit, the second bit, and the fourth bit in the corresponding set of transformed bits are false.

Clause 29. The digital-to-analog converter of clause 28, wherein each multiplexer is configured to close its fourth switch responsive to the fourth bit in the corresponding set of transformed bits being true while the first bit, the second bit, and the third bit in the corresponding set of transformed bits are false.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A combined in-phase and quadrature-phase digital-to-analog converter comprising:

a plurality of selectors corresponding to a plurality of in-phase and quadrature-phase bit pairs, each selector being configured to receive a corresponding in-phase and quadrature-phase bit pair from the plurality of in-phase and quadrature-phase bit pairs;

a plurality of sources corresponding to the plurality of selectors, wherein each selector is configured to convert a source signal from a corresponding source from the plurality of sources into an in-phase analog input signal and a quadrature-phase analog input signal responsive to the corresponding in-phase and quadrature-phase bit pair; and a summation network configured to sum the in-phase analog input signals from each selector in the plurality of selectors to form an in-phase analog output signal and to sum the quadrature-phase analog input signals from each selector in the plurality of selectors to form a quadrature-phase analog output signal.

2. The combined in-phase and quadrature-phase digital-to-analog converter of claim 1, wherein the plurality of sources is arranged from a least-significant source to a most-significant source, and wherein each source in the plurality of sources is configured to provide a binary weight to its source signal according to a binary weighting progression from the least-significant source to the most-significant source.

3. The combined in-phase and quadrature-phase digital-to-analog converter of claim 1, wherein each source in the plurality of sources is configured to provide a unitary weight to its source signal.

4. The combined in-phase and quadrature-phase digital-to-analog converter of claim 3, further comprising:

a logic circuit configured to rotate each in-phase and quadrature-phase bit pair into a set of rotated bits, wherein each selector is configured to convert the source signal from the corresponding source into the in-phase analog input signal and the quadrature-phase analog input signal responsive to the set of rotated bits from the rotation of the corresponding in-phase and quadrature-phase bit pair.

5. The combined in-phase and quadrature-phase digital-to-analog converter of claim 1, wherein a first subset of sources in the plurality of sources is arranged from a least-significant source to a most-significant source, and wherein each source in the first subset of sources is configured to provide a binary weight to its source signal according to a binary weighting progression from the least-significant source to the most-significant source, and wherein each source is a second subset of sources in the plurality of sources is configured to provide a unitary weight to its source signal.

6. The combined in-phase and quadrature-phase digital-to-analog converter of claim 1, wherein each source is a current source, and wherein the source signal from each source is a current signal.

7. The combined in-phase and quadrature-phase digital-to-analog converter of claim 1, wherein each source is a charge source, and wherein the source signal from each source is a charge signal.

8. The combined in-phase and quadrature-phase digital-to-analog converter of claim 1, wherein each source is a voltage source, and wherein the source signal from each source is a voltage signal.

9. The combined in-phase and quadrature-phase digital-to-analog converter of claim 1, wherein the summation network is configured to sum the in-phase analog input signals from each selector in the plurality of selectors to form the in-phase analog output signal according to a summation network weighting progression from a least-significant selector to a most-significant selector and to sum the quadrature-phase analog input signals from each selector in the plurality of selectors to form the quadrature-phase analog output signal according to the summation network weighting progression.

10. The combined in-phase and quadrature-phase digital-to-analog converter of claim 9, wherein the summation network weighting progression is a unitary weighting.

11. The combined in-phase and quadrature-phase digital-to-analog converter of claim 1, wherein the combined in-phase and quadrature-phase digital-to-analog converter is included in an analog-to-digital converter.

12. The combined in-phase and quadrature-phase digital-to-analog converter of claim 11, wherein the analog-to-digital converter is a sigma-delta analog-to-digital converter.

13. The combined in-phase and quadrature-phase digital-to-analog converter of claim 1, wherein each selector comprises a plurality of switches.

14. The combined in-phase and quadrature-phase digital-to-analog converter of claim 1, wherein each selector in the plurality of selectors comprises a set of four switches coupled between the corresponding source and the summation network.

15. The combined in-phase and quadrature-phase digital-to-analog converter of claim 1, wherein the combined in-phase and quadrature-phase digital-to-analog converter is incorporated in a transmitter in a user equipment.

16. A method of operation for a combined I/Q DAC, comprising:

driving a plurality of multiplexers with a corresponding plurality of source signals such that each multiplexer is driven with a corresponding source signal from the plurality of source signals;

providing each multiplexer with a corresponding in-phase and quadrature-phase bit pair; and multiplexing the corresponding source signal through each multiplexer to a node in a summation network responsive to a digital value of the corresponding in-phase and quadrature-phase bit pair.

17. The method of operation of claim 16, further comprising:

rotating each corresponding in-phase and quadrature-phase bit pair to form a set of rotated input bits so that for each digital value only one of the rotated input bits in the set of rotated input bits has a binary true value, wherein multiplexing the corresponding source signal through each multiplexer comprises routing the corresponding source signal to the node responsive to the rotated input bit having the binary true value.

18. The method of operation of claim 16, wherein multiplexing the corresponding source signal through each multiplexer comprises:

routing the corresponding source signal to a first node in the summation network responsive to a first digital value of the corresponding in-phase and quadrature-phase bit pair; and routing the corresponding source signal to a second node in the summation network responsive to a second digital value of the corresponding in-phase and quadrature-phase bit pair.

19. The method of operation of claim 18, wherein multiplexing the corresponding source signal through each multiplexer further comprises:

routing the corresponding source signal to a third node in the summation network responsive to a third digital value of the corresponding in-phase and quadrature-phase bit pair; and routing the corresponding source signal to a fourth node in the summation network responsive to a fourth digital value of the corresponding in-phase and quadrature-phase bit pair.

20. A digital-to-analog converter, comprising:
a summation network including a plurality of nodes for an in-phase analog output signal and a quadrature-phase analog output signal;
a plurality of sources; and
a plurality of multiplexers corresponding to the plurality of sources, each multiplexer coupled to a corresponding source from the plurality of sources and being configured to multiplex a source signal from the corresponding source to a corresponding node from the plurality of nodes responsive to a digital value of a corresponding in-phase and quadrature-phase bit pair.

21. The digital-to-analog converter of claim 20, wherein the plurality of nodes comprises:
a first node for a positive component of the in-phase analog output signal;
a second node for a negative component of the in-phase analog output signal;
a third node for a positive component of the quadrature-phase analog output signal; and
a fourth node for a negative component of the quadrature-phase analog output signal.

22. The digital-to-analog converter of claim 21, wherein each multiplexer comprises:
a first switch coupled between the corresponding source and the first node;
a second switch coupled between the corresponding source and the second node;
a third switch coupled between the corresponding source and the third node; and
a fourth switch coupled between the corresponding source and the fourth node.

23. The digital-to-analog converter of claim 21, wherein each source is a current source.

24. The digital-to-analog converter of claim 21, wherein each source is a voltage source.

25. The digital-to-analog converter of claim 21, wherein each source is a charge source.

26. The digital-to-analog converter of claim 22, further comprising:
a logic circuit configured to transform each corresponding in-phase and quadrature-phase bit pair into a corresponding set of four transformed bits, wherein each multiplexer is configured to close its first switch responsive to a first bit in the corresponding set of transformed bits being true while a second bit, a third bit, and a fourth bit in the corresponding set of transformed bits are false.

27. The digital-to-analog converter of claim 26, wherein each multiplexer is configured to close its second switch responsive to the second bit in the corresponding set of transformed bits being true while the first bit, the third bit, and the fourth bit in the corresponding set of transformed bits are false.

28. The digital-to-analog converter of claim 27, wherein each multiplexer is configured to close its third switch responsive to the third bit in the corresponding set of transformed bits being true while the first bit, the second bit, and the fourth bit in the corresponding set of transformed bits are false.

29. The digital-to-analog converter of claim 28, wherein each multiplexer is configured to close its fourth switch responsive to the fourth bit in the corresponding set of transformed bits being true while the first bit, the second bit, and the third bit in the corresponding set of transformed bits are false.

* * * * *